United States Patent [19]
Chen et al.

[11] Patent Number: 6,093,038
[45] Date of Patent: Jul. 25, 2000

[54] MOVABLE CONNECTOR BOARD FOR COMPUTER

[75] Inventors: Ta-Hua Chen; Chun-Yen Yeh, both of Taipei, Taiwan

[73] Assignee: Inventec Corp., Taipei, Taiwan

[21] Appl. No.: 09/200,401

[22] Filed: Nov. 28, 1998

[51] Int. Cl.[7] ................................................. H01R 13/44
[52] U.S. Cl. .............................. 439/131; 439/164; 439/31
[58] Field of Search .................................. 439/131, 164, 439/31, 341, 344; 361/741, 391, 756, 802

[56] References Cited

U.S. PATENT DOCUMENTS

| | | | |
|---|---|---|---|
| 5,097,392 | 3/1992 | Tanaka et al. | 361/391 |
| 5,342,993 | 8/1994 | Siems | 439/131 |
| 5,598,319 | 1/1997 | Lee | 439/131 |
| 5,637,018 | 6/1997 | Gargiulo | 439/640 |
| 5,745,345 | 4/1998 | Deguchi | 361/741 |

*Primary Examiner*—Khiem Nguyen
*Assistant Examiner*—Son V. Nguyen
*Attorney, Agent, or Firm*—W. Wayne Liauh

[57] ABSTRACT

The present invention provides a movable connector board which is mounted with interface connectors for its peripheral devices. The board prevents the user from inconvenience of connecting devices on the back of the computer. The connector board is movable to a usage position where the peripheral devices can be easily connected to or disconnected from the computer without rotating, turning or moving the computer.

12 Claims, 5 Drawing Sheets

MOVABLE CONNECTOR BOARD FOR COMPUTER

BACKGROUND OF THE INVENTION

The present invention relates to a movable connector board for a computer, and especially for a notebook computer. The connector board is mounted with interface connectors of the computer for its peripheral devices. The board is movable to a suitable position where the peripheral devices can be easily connected to or disconnected from the computer.

Currently, computers are used widely by people. Personal computers have been reduced in dimensions and become "notebook" computers which have small size like notebooks. The notebook computers are portable data processors for anytime and anywhere and become a useful tool of information management.

Manufacturers of notebook computer generally emphasize on the facilities or performance of the notebook computer, such as CD driver, modem, battery work time and heat dissipation. Facilities and performance are of course the major issues for customers, but the convenience of use should also be an important consideration based on the "portable" use.

Though notebook computers are reduced size from desktop computers, the usage situation, especially the connection of peripheral devices to the notebook computers, is not the same as desktop computers. For example, the peripheral devices, such as a printer or modem, of a desktop computer will not be often detached from the computer after connection unless a failure happens or a change needed. But for a notebook computer, since its portable use, no peripheral device is fixed to. The devices are unpreventably attached to and detached from the notebook computer by the user each time before and after use.

Before using a notebook computer, the user has to firstly lay the computer on the table, then connects the power cord and some peripheral devices one by one to the notebook computer with the following manner:

a) Stands up for easily watching and connecting the device cords or connectors, and then sits down; or b) Rotates the notebook computer with its back forward to the user for connecting, and turns it back; or c) Turns over the notebook computer with its back upward for easily connecting, then lays it down again; or d) Moves the notebook computer forward to the user for connecting, and moves it back for use.

After use, the user has to disconnect the device connectors by a reverse sequence of the aforesaid manners.

The aforesaid manners of rotating, turning or moving the computer, standing up and sitting down, are all caused by the inconvenience of the connectors of the notebook computer that are located at the back of the computer and are reverse to the direction of the user. Therefore, on the demand of frequent connection and disconnection of the device connectors to the notebook computer, the convenience of which is not achieved by the prior notebook computers.

In order to overcome the aforesaid inconvenience of the connectors locating at the back of notebook computers, the present invention provides a movable connector board which is mounted with interface connectors for its peripheral devices. The board is movable to a suitable position where the peripheral devices can be easily connected to or disconnected from the notebook computer. Therefore, it solves the problem of inconvenience of prior notebook computers.

The objectives and advantages of the present invention will become apparent from a detailed description provided below, with reference to the accompanying drawings.

DETAILED DESCRIPTION OF PREFERRED EMBODIMENTS

Figure 1:
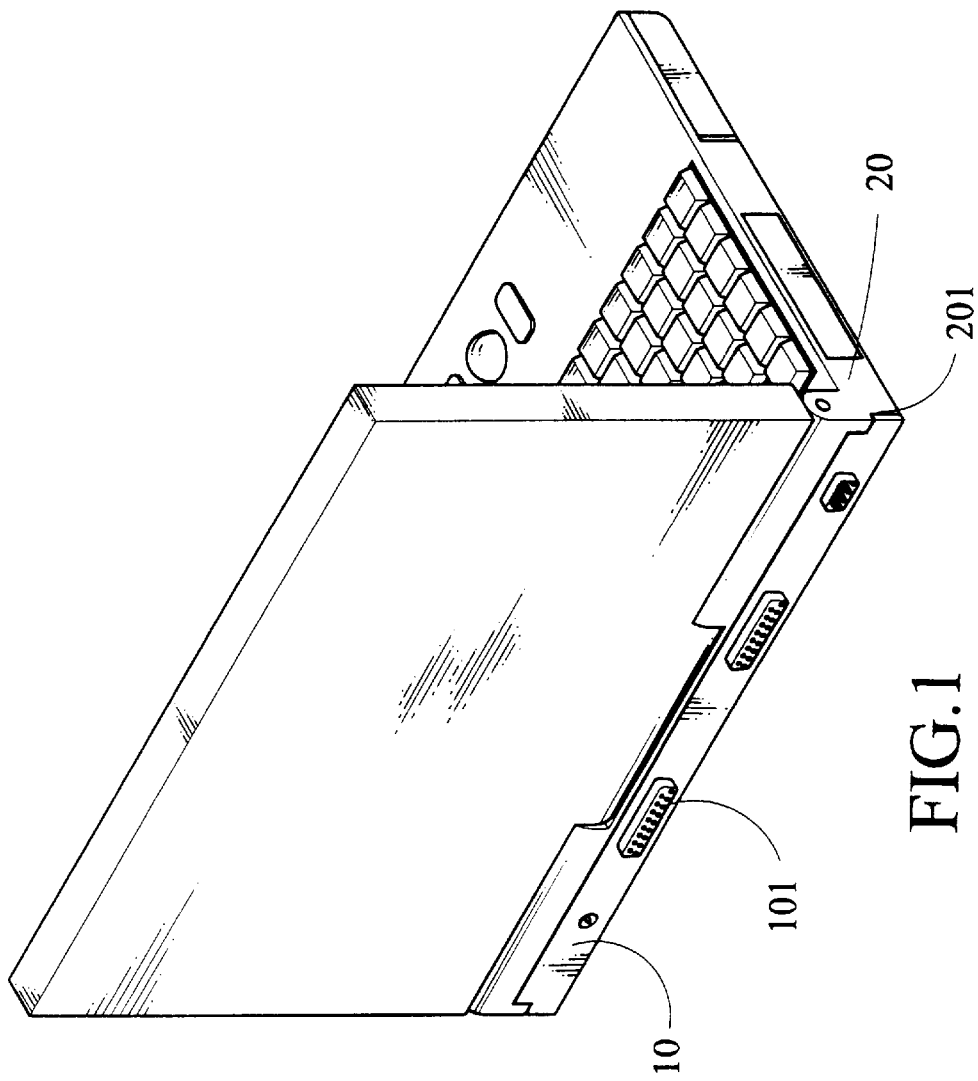
FIG. 1 is a perspective view showing a connector board for a notebook computer according to the present invention.
Figure 2:
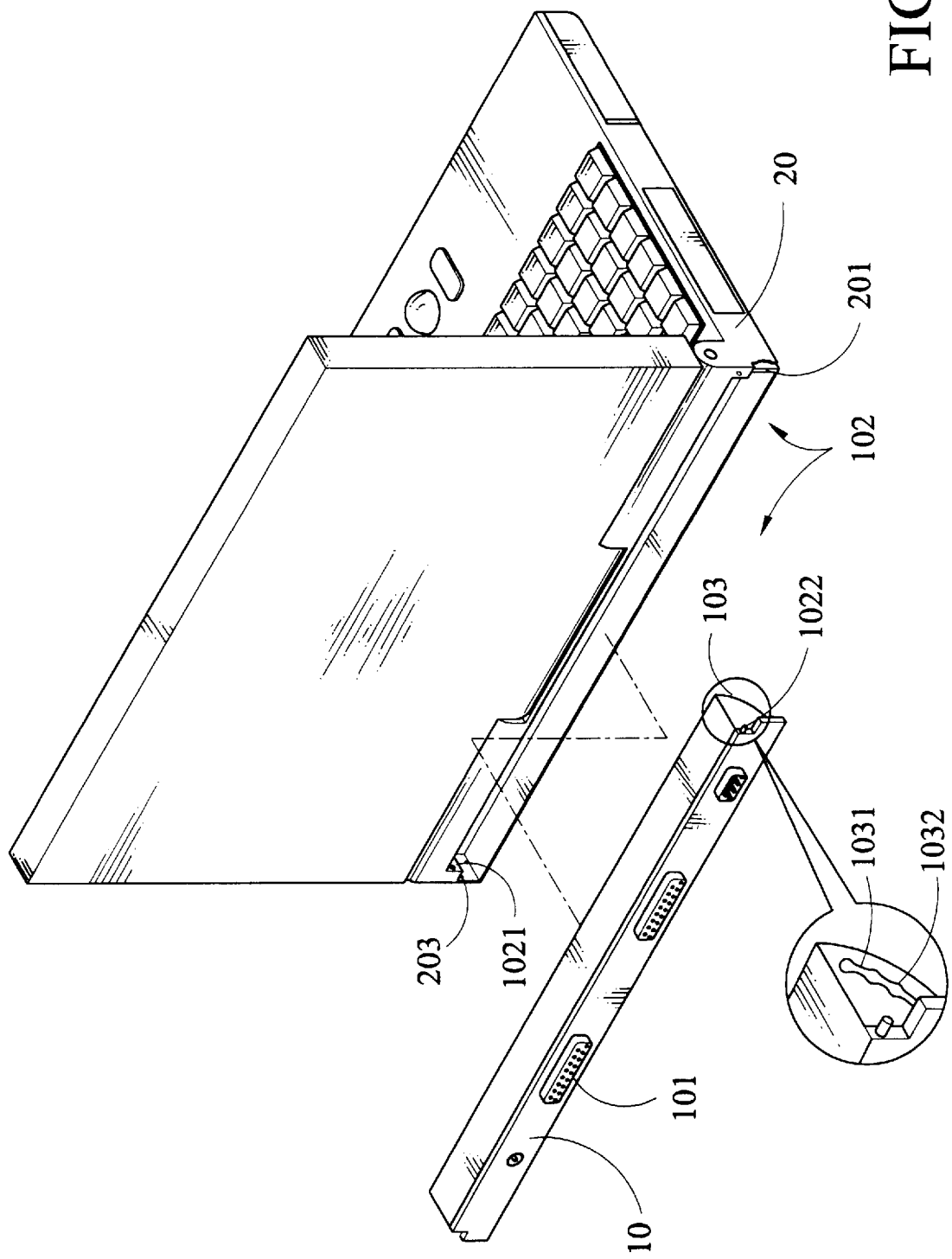
FIG. 2 is an exploded view of a connector board for a notebook computer according to the present invention.
Figure 3:
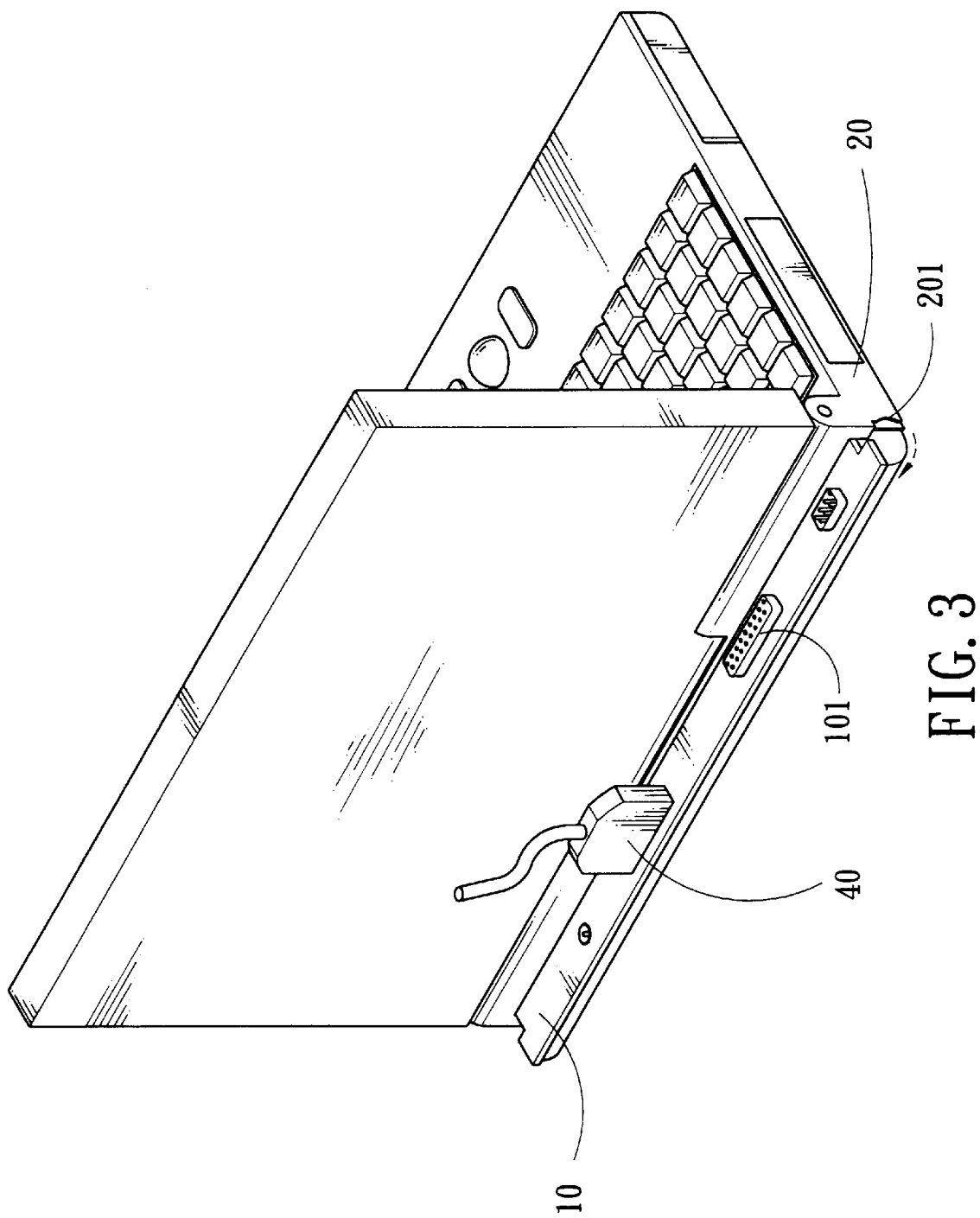
FIG. 3 is an explanatory view showing usage of a connector board for a notebook computer according to the present invention.
Figure 4:
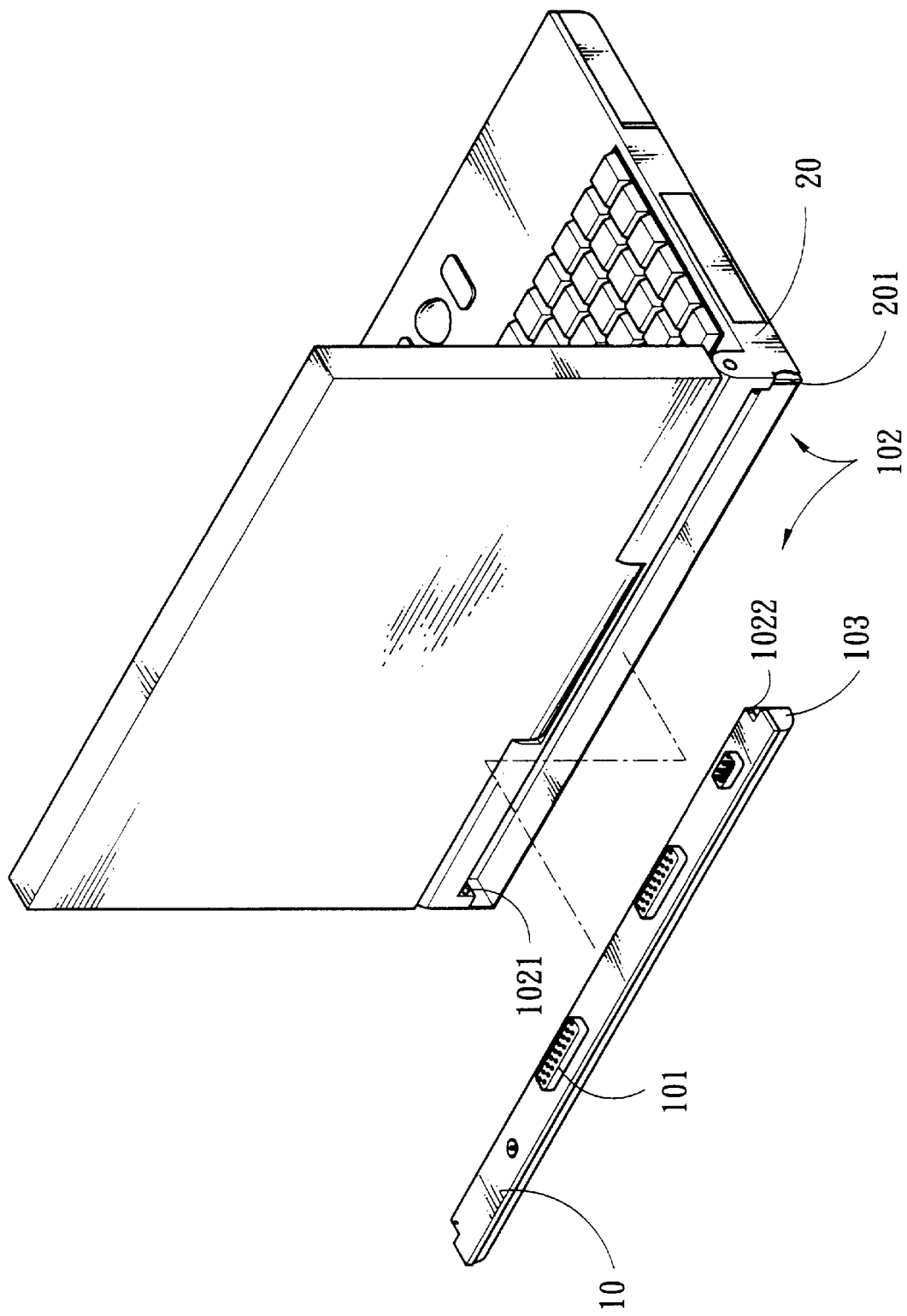
FIG. 4 is an exploded view of a connector board for a notebook computer in which the connector board is moved to an usage position.

Referring to FIG. 1 and FIG. 2, a movable connector board of a notebook computer according to the present invention includes a connector board 10 on which several interface connectors 101 are mounted. As shown in FIG. 2 or FIG. 4, the board 10 has two pivotal portions 102 for rotating the board relatively to the case 20 of the notebook computer. Each of the pivotal portions 102 includes a hole 1021 and a shaft 1022 furnished respectively on the case 20 and the connector board 10 (or vice versa as shown in FIG. 4), and provides relative rotation of the connector board 10 to the notebook computer. The connector board 10 therefore can be moved to a storage position covering the case 20 as shown in FIG. 1, and moved to a usage position for connecting the peripheral devices 40 as shown in FIG. 3. For easily rotating the connector board 10, two grips 201 can be formed on the case 20 adjacent to the connector board 10. Of course, other pivotal manner for the pivotal portions 102, such as hinges, can be used.

Figure 5:
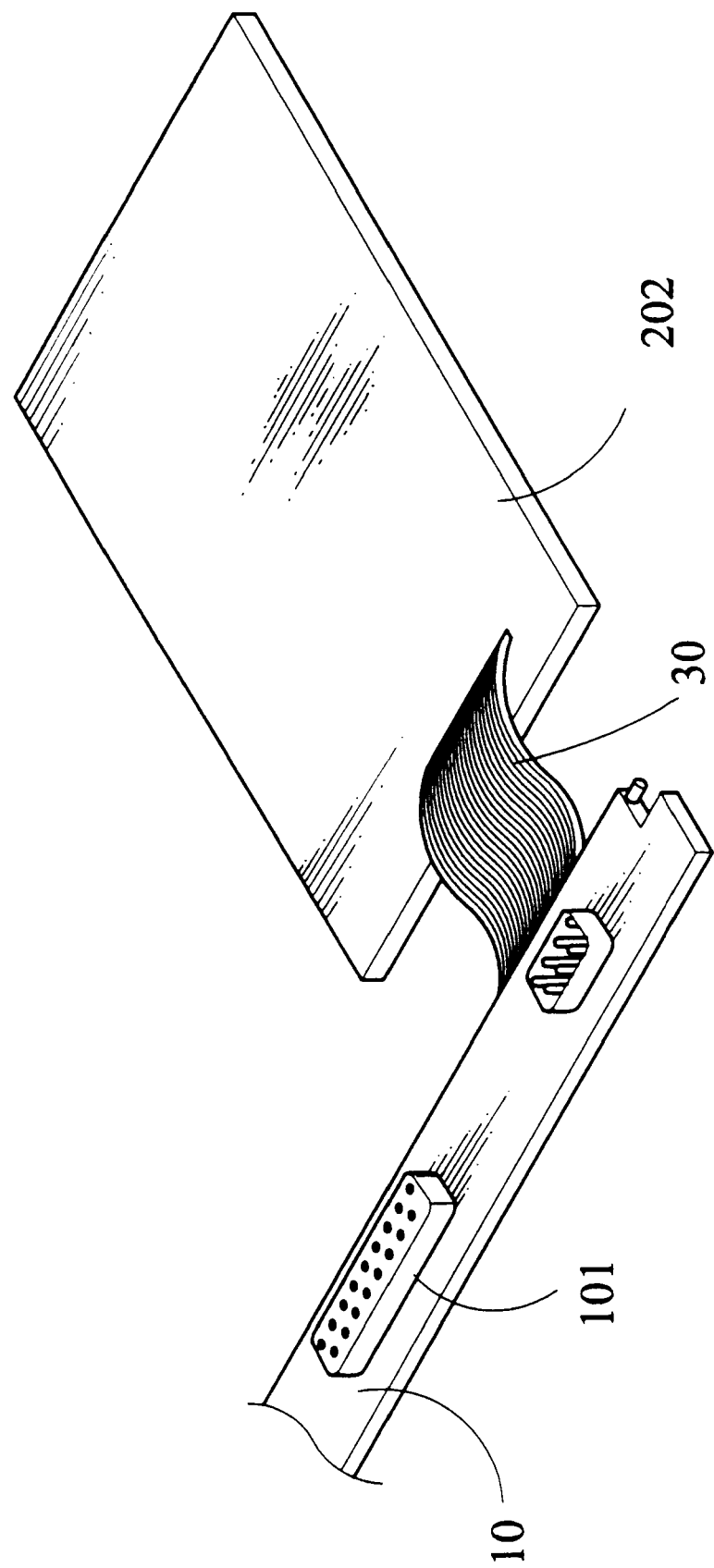
FIG. 5 is a partial view showing construction of a connector board for a notebook computer according to the present invention.

As for the electrical connection of the connectors 101 to the main board 202, as shown in FIG. 5, of the notebook computer, some soft wires 30 such as flexible printed circuit (FPC) can be used in order to fulfill the demand of rotation without interference to the electrical connection.

Furthermore, there can be two wings 103 formed on the ends of the connector board 10 which are furnished with grooves 1031 and several positioning points 1032. On the portions of the case 20 that match the grooves 1031, two protrusions 203 are formed in order to pressurizedly position the connector board 10 relatively to the case 20 at some desired positions when rotating the board 10.

As shown in FIG. 3, the connector board 10 according the present invention makes the user easily connects and disconnects peripheral devices 40 to and from the notebook computer by rotating up the connector board 10.

Though the aforesaid embodiments are described according to notebook computers, the present invention may also be applied to desktop computers. Since a desktop computer is commonly placed on a desk leaned against a wall, the backward space of the desktop computer is generally limited. The connectors or wires of peripheral devices connected on the back of the computer are easily bent or dislocated and cause disconnection or damage. In this situation, a movable connector board for the desktop computer is also helpful.

In conclusion, the present invention provides a user-friendly connector board for a notebook or desktop computer. It helps the user for easily connecting peripheral devices to the computer, and increase the convenience of usage of the computer.

Although the invention has been described in connection with preferred embodiments, it will be understood by those skilled in the art that various changes may be made without departing from its scope.

I claim:

1. A movable connector board for use with a portable computer containing a base member and a foldable monitor member, said movable connector board being pivotally connected to a rear face of said base member, and comprising:
   - a plurality of input and output interface connectors for electrical connections of said computer to peripheral devices;
   - a board for mounting said input and output interface connectors, said board being pivotally receivable in an elongated hole provided in said rear face of said base member;
   - a pivotal connection member provided at one end of said board to allow said board to move from a first position, and to where said interface connectors are pointing horizontally for storage, and to a second position, where said interface connectors are pointing up vertically for easy connection of the peripheral devices to the interface connectors.

2. A movable connector board for use with a portable computer according to claim 1 wherein said board is formed with at least a pivotal portion for rotating relative to said rear face of said base member.

3. A movable connector board for use with a portable computer according to claim 2 wherein said pivotal portion comprises:
   - a hole furnished on said rear face of said base member; and
   - a shaft furnished on said board and pivots on said hole for holding said board in said storage and usage positions.

4. A movable connector board for use with a portable computer according to claim 2 wherein said pivotal portion comprises:
   - a shaft furnished on said rear race of said base member; and
   - a hole furnished on said board and pivots on said shaft for holding said board in said storage and usage positions.

5. A movable connector board for use with a portable computer according to claim 2 wherein said pivotal portion comprises a shaft.

6. A movable connector board for use with a portable computer according to claim 2 wherein said pivotal portion comprises a hinge.

7. A movable connector board for use with a portable computer according to claim 1 wherein said plurality of input and output interface connectors are electrically connecting via several soft wires to a main board of said base member.

8. A movable connector board for use with a portable computer according to claim 7 wherein the soft wire is a flexible printed circuit.

9. A movable connector board for use with a portable computer according to claim 1 wherein said board and said rear face of said base member are furnished with at least a finger grip for a user to move said connector board easily.

10. A movable connector board for use with a portable computer according to claim 1 wherein said connector board is formed with a wing at said pivotal portion.

11. A movable connector board for use with a portable computer according to claim 7 wherein said wing is furnished with a groove and a plurality of positioning points, and a protrusion is formed on a portion of said computer relative to said groove for pressurizedly positioning said connector board relatively to said computer at some predetermined positions when moving said connector board.

12. A portable computer containing a base member having a keyboard and a foldable member having a monitor screen, said base member containing a movable connector board pivotally connected to a rear face of said base member, and said movable connector comprising:
   - a plurality of input and output interface connection ports for electrical connections of said computer to peripheral devices;
   - a board for mounting said input and output interface connectors, said board being pivotally receivable in an elongated hole provided in said rear face of said base member;
   - a pivotal connection member provided at one end of said board to allow said board to move from a first position, where said interface connectors are pointing horizontally for storage, and to a second position, where said interface connectors are pointing up vertically for easy connection of the peripheral devices to the interface connectors.

* * * * *